United States Patent
Ogawa

(10) Patent No.: US 7,755,163 B2
(45) Date of Patent: Jul. 13, 2010

(54) ANTIFUSE ELEMENT AND SEMICONDUCTOR DEVICE INCLUDING SAME

(75) Inventor: Sumio Ogawa, Tokyo (JP)

(73) Assignee: Elpida Memory, Inc., Chou-ku, Tokyo (JP)

( * ) Notice: Subject to any disclaimer, the term of this patent is extended or adjusted under 35 U.S.C. 154(b) by 0 days.

(21) Appl. No.: 12/219,587

(22) Filed: Jul. 24, 2008

(65) Prior Publication Data

US 2009/0026577 A1    Jan. 29, 2009

(30) Foreign Application Priority Data

Jul. 27, 2007    (JP) .............................. 2007-195979

(51) Int. Cl.
*H01L 29/00* (2006.01)
(52) U.S. Cl. ............................... 257/530; 257/E23.147
(58) Field of Classification Search ................. 257/530, 257/346, 402, 653, E23.147
See application file for complete search history.

(56) References Cited

U.S. PATENT DOCUMENTS

| | | | |
|---|---|---|---|
| 5,612,565 A * | 3/1997 | Kusumoto | ................. 257/401 |
| 6,700,176 B2 | 3/2004 | Ito et al. | |
| 6,902,958 B2 | 6/2005 | Ito et al. | |
| 2005/0258482 A1 | 11/2005 | Ito et al. | |

* cited by examiner

*Primary Examiner*—Mark Prenty
(74) *Attorney, Agent, or Firm*—McGinn IP Law Group, PLLC

(57) ABSTRACT

To provide an antifuse element comprising a gate electrode, a depletion channel region, a gate insulating film between the gate electrode and the channel region, and a diffusion layer region forming a junction with the channel region. An end of the gate electrode coincides substantially with a boundary between the channel region and the diffusion layer region as seen from a planar view, and is formed in a zigzag configuration. The end of the gate electrode is longer than the end with linear configuration and the end of the gate insulating film is likely to be subjected to breakdown.

16 Claims, 9 Drawing Sheets

ANTIFUSE ELEMENT AND SEMICONDUCTOR DEVICE INCLUDING SAME

TECHNICAL FIELD

The present invention relates to an antifuse element and a semiconductor device including the same, and, more particularly relates to an antifuse element that can be changed from an electrically isolated state to an electrically conductive state by dielectric breakdown and a semiconductor device including the same.

BACKGROUND OF THE INVENTION

In semiconductor devices including a DRAM (Dynamic Random Access Memory), defective cells that do not operate properly are replaced with redundancy cells to relieve defective addresses. Usually, fuse elements are utilized to store the defective addresses. Laser beams are irradiated to the fuse elements so as to disconnect them irreversibly, so that the defective addresses are stored. The usual fuse elements can store information in a nonvolatile manner by changed from the conductive state to the isolated state.

Meanwhile, antifuse elements have attracted attention in recent years (see U.S. Pat. Nos. 6,902,958 and 6,700,176, and U.S. Patent Application Publication No. 2005/0258482). The antifuse elements store information, as opposed to the usual fuse elements, by changed from the isolated state to the conductive state. The configuration of the antifuse elements is almost the same as that of depletion MOS transistors. When the gate insulating film is subjected to breakdown by a high voltage applied between the gate electrode and the electrode common to the source and drain, the antifuse element is changed from the isolated state to the conductive state.

Because the antifuse element has the same configuration as the depletion MOS transistor, its occupied area is smaller than the usual fuse element and the passivation film is not broken by the laser irradiation.

However, the antifuse element has a problem of a large variation in resistance in the conductive state. Reasons why the resistance is varied in the conductive state are explained below.

FIG. 9 is a schematic diagram of a configuration of a conventional antifuse element.

As shown in FIG. 9, a generally used antifuse element includes a gate electrode 12, a source region 14, and a drain region 16. The source region 14 and the drain region 16 are shorted by the wirings. In the initial state, the gate electrode 12 is isolated from a channel region 20 by a gate insulating film 18. The gate electrode 12 is thus isolated from the source region 14 and the drain region 16. When a breakdown region 18a is formed in the gate insulating film 18 by applying a high voltage to the gate electrode 12, the gate electrode 12, the source region 14, and the drain region 16 are short-circuited via the depletion channel region 20.

Thus, by detecting whether current flows between a terminal D connected to the gate electrode 12 and a terminal E connected to the source region 14 and the drain region 16, whether the breakdown region 18a is formed in the gate insulating film 18 is determined.

FIG. 10 is an equivalent circuit diagram of the antifuse element in the breakdown state.

As shown in FIG. 10, if the antifuse element is subjected to breakdown, a resistance component Rg for the gate electrode 12 and the breakdown region 18a is connected to a parallel circuit of a channel resistance component Rs on the source region 14 side and a channel resistance component Rd on the drain region 16 side between the terminals D and E. The resistance components Rs and Rd vary depending on the position of the breakdown region 18a formed. The position of the breakdown region 18a formed depends on a predetermined probability distribution. The breakdown region 18a can be formed in the vicinity of the source region 14 or the drain region 16, or can be formed at the substantial intermediate position between the source region 14 and the drain region 16.

When the breakdown region 18a is formed in the vicinity of the source region 14 or the drain region 16, one of the resistance components Rs and Rd is reduced significantly. The resistance between the terminals D and E is thus relatively small. When the breakdown region 18a is formed at the substantial intermediate position between the source region 14 and the drain region 16, the resistance components Rs and Rd are increased, resulting in relatively large resistance between the terminals D and E.

When Rs=Rd, that is, when the breakdown region 18a is formed at the intermediate position, the resistance Rde between the terminals D and E is given by the following formula.

$$Rde = Rg + Rs \cdot Rd/(Rs+Rd) = Rg + Rd/2$$

In contrast, when Rs>>Rd, that is, when the breakdown region 18a is formed at either of the ends (e.g., in the vicinity of the drain region 16), Rd≈0. The resistance Rde between the terminals D and E is given by the following formula.

$$Rde = Rg + Rs \cdot Rd/(Rs+Rd) \approx Rg$$

A normal sheet resistance is a hundred and several tens $\Omega/\Box$ on a gate resistance layer and a few K$\Omega/\Box$ to a several hundred M$\Omega/\Box$ on a depletion channel resistive layer. The resistance Rde depends substantially on the depletion channel resistive layer.

Even if the antifuse element is subjected to breakdown in the substantially same voltage conditions, the resistance between the terminals D and E is inevitably varied greatly. Such a variation makes it difficult for thresholds to be set when it is determined whether the breakdown region 18a is formed. Sometimes that may cause wrong determination. The resistance between the terminals D and E may be relatively large even after breakdown. The detection sensitivity needs to be set high to some extent. The time required for determination is extended, which prevents high speed operation of semiconductor devices.

SUMMARY OF THE INVENTION

It is therefore an object of the present invention to provide an improved antifuse element and a semiconductor device using the same.

Another object of the present invention is to provide an antifuse element with a suppressed variation in resistance after breakdown and a semiconductor device using the same.

Still another object of the present invention is to provide an antifuse element with relatively small resistance after breakdown and a semiconductor device using the same.

As the result of researches of the antifuse element, the present inventor found that breakdown is likely to occur at the ends of the gate insulating film as compared to the central part. This is because the gate insulating film is not perfectly homogenous but inhomogeneous to some extent and breakdown thus occurs at parts with the lowest withstand pressure. The parts with low withstand pressure tend to be generated at the ends of the gate insulating film subjected to stresses during many manufacturing processes. This is considered to be the reason why breakdown is likely to occur at the ends.

The present invention has been achieved based on such technical knowledge. The antifuse element according to the present invention includes an upper electrode, a lower electrode, an insulating film between the upper electrode and the lower electrode, and an extraction electrode adjacent to the lower electrode. Breakdown of the insulating film electrically connects the upper electrode to the extraction electrode via the lower electrode. The predetermined end of the upper electrode substantially coincides with a boundary between the lower electrode and the extraction electrode as seen from a planar view and is formed in a non-linear configuration.

"The non-linear configuration" includes any configurations that realize longer distance of a unit interval than a linear distance including a curved configuration and a zigzag configuration. Configurations that realize the distance of the unit interval longer than the linear distance by 50% or more are effectively desirable. According to the present invention, the longer distance of the unit interval is preferable. That is, it is preferable that the predetermined end of the upper electrode is extended. The zigzag configuration is thus preferably used.

A semiconductor device according to the present invention comprises said antifuse element; a write circuit for causing breakdown of the insulating film by applying a high voltage to the upper electrode; and a readout circuit for detecting resistance between the upper electrode and the extraction electrode.

According to the present invention, as the predetermined end of the upper electrode is formed in a non-linear configuration, the predetermined end is longer than the end with a linear configuration. The end of the insulating film is thus likely to be subjected to breakdown. Variations in resistance after breakdown are suppressed and the resistance after breakdown is reduced.

With the antifuse element according to the present invention, when determining whether the antifuse element is subjected to breakdown, the time required for the determination is reduced without wrong determination. The antifuse element is applied to circuits requiring high speed operations.

BRIEF DESCRIPTION OF THE DRAWINGS

The above and other objects, features and advantages of this invention will become more apparent by reference to the following detailed description of the invention taken in conjunction with the accompanying drawings, wherein.

DETAILED DESCRIPTION OF THE EMBODIMENTS

Preferred embodiments of the present invention will now be explained in detail with reference to the drawings.

Figure 1A:
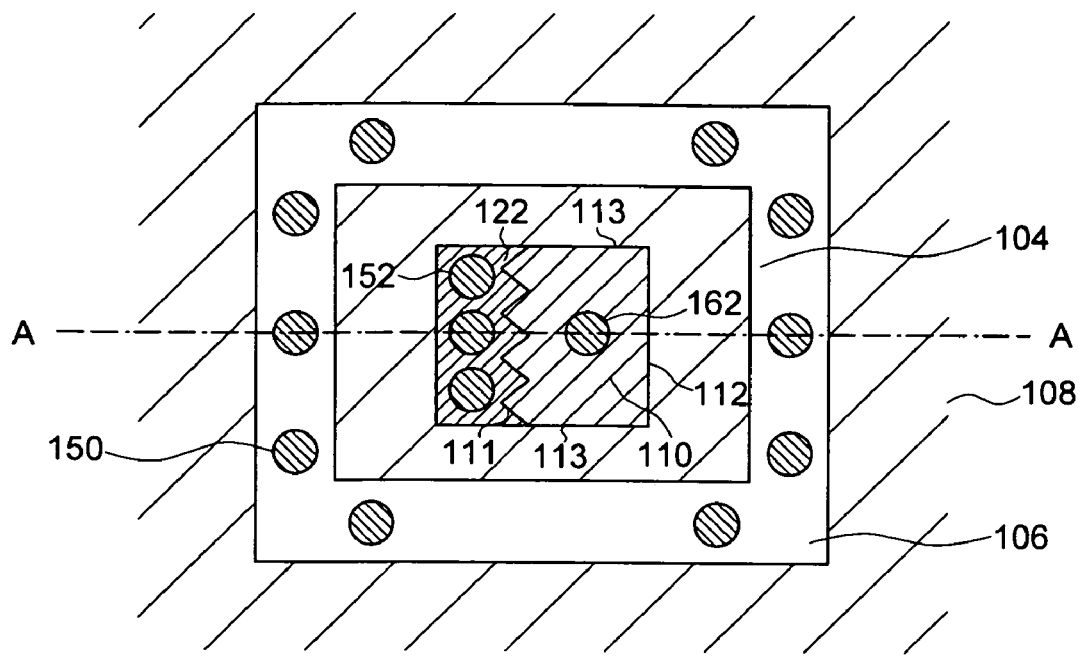
FIG. 1A shows a schematic plan view of an antifuse element according to a first embodiment of the present invention.
Figure 1B:
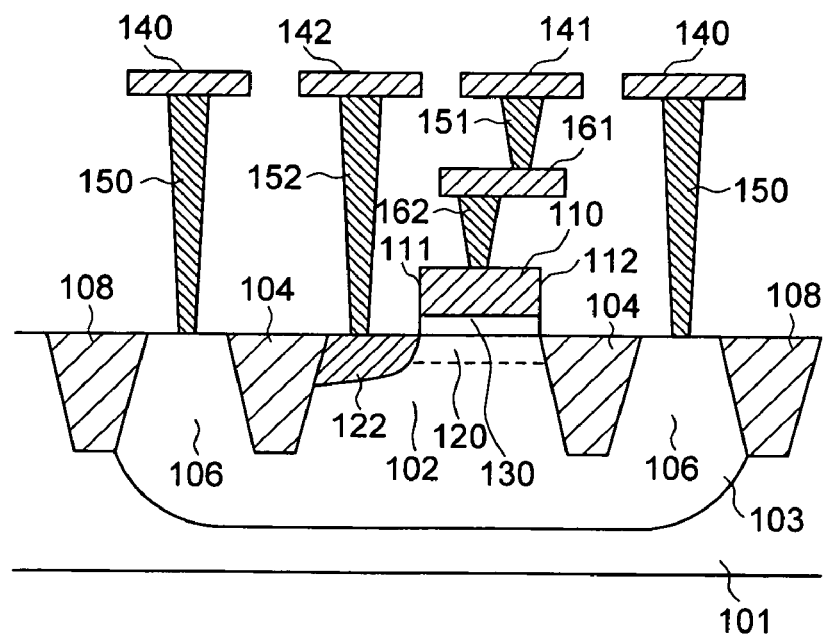
FIG. 1B shows a schematic cross-sectional view along the line A-A in FIG. 1A.

FIGS. 1A and 1B show a configuration of an antifuse element 100 according to a first embodiment of the present invention, where FIG. 1A is a schematic plan view, and FIG. 1B is a schematic cross-sectional view along the line A-A in FIG. 1A. A part of components including upper wirings is omitted in FIG. 1A for clarity of illustration.

As shown in FIGS. 1A and 1B, while the antifuse element 100 of the first embodiment has, as conventional antifuse elements, a similar configuration to that of a depletion MOS transistor, it is different from the conventional antifuse elements in that an end of a gate electrode 110 is formed in a zigzag configuration and one of a source region and a drain region is removed. Detailed explanations are given below.

The antifuse element 100 according to the first embodiment includes a gate electrode 110 as an upper electrode, a depletion channel region 120 as a lower electrode, a gate insulating film 130 located between the gate electrode 110 and the channel region 120, and a diffusion layer region 122 as an extraction electrode. In spite of the channel region 120 forming a PN junction with the diffusion layer region 122, they are in the conductive state because the channel region 120 is of the depletion type.

As shown in FIG. 1A, the end 111 of the gate electrode 110 on the diffusion layer region 122 side coincides with a boundary between the channel region 120 and the diffusion layer region 122 as can be seen from a planar view. Such a configuration is obtained by implanting ions in an active region 102 using the gate electrode 110 as a mask. As can be seen from a planar view, the end 111 of the gate electrode 110 is formed in a zigzag configuration. Although not particularly restricted, other ends 112 and 113 of the gate electrode 110 coincide substantially with the periphery of the active region 102.

Only the channel region 120 and the diffusion layer region 122 are provided in the active region 102. Unlike normal antifuse elements, paired two diffusion layer regions do not exist. That is, one of the source region and drain region is removed.

As seen from a planar view, the active region 102 is surrounded by an element isolation region 104 which is surrounded by a contact region 106. The contact region 106 is surrounded by an element isolation region 108. As shown in FIG. 1B, the element isolation region 104 is provided within a P-well region 103 so as to be separated surely from other elements (not shown) formed in an N-type substrate 101.

Potential is supplied from the ring-shaped contact region 106 via an upper wiring 140 and a contact 150 to the P-well region 103.

Potential is supplied to the gate electrode 110 via an upper wiring 161 and a contact 162. The upper wiring 161 is connected via a contact 151 to another upper wiring 141. Potential is supplied to the diffusion layer region 122 via an upper wiring 142 and a contact 152.

The contact 162 connecting the gate electrode 110 to the upper wiring 161 is placed immediately above the channel region 120. According to usual MOS transistors, a gate electrode includes a contact region extended on an element isolation region. A contact is usually formed on the contact region. If the contact is formed immediately above the channel region 120, transistor characteristics may be changed by stresses generated at the time of forming the contact. The function of the antifuse element may not be affected greatly by the changes in characteristics. The contact 162 is thus placed immediately above the channel region 120 in the first embodiment.

Figure 2:
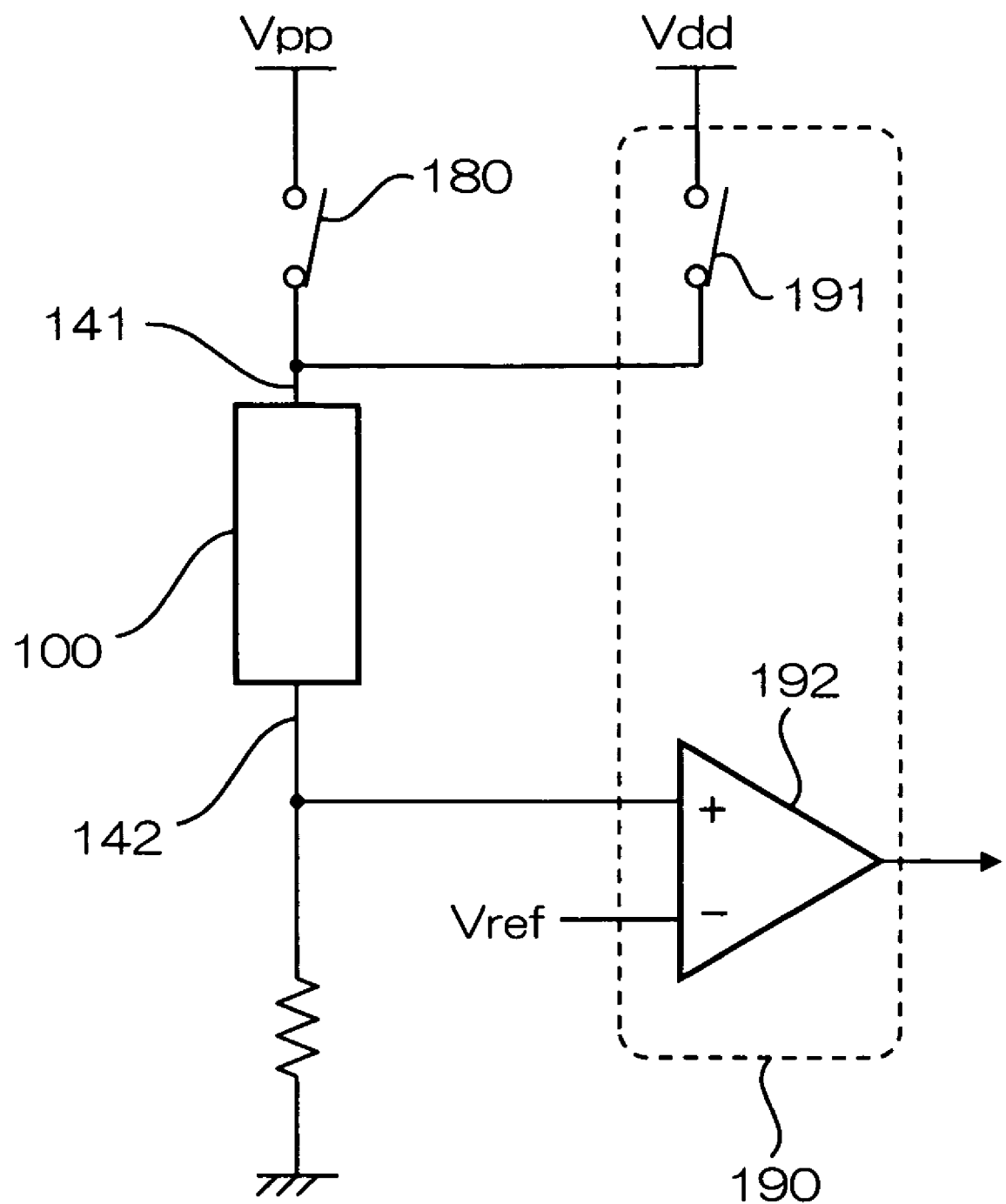
FIG. 2 is a circuit diagram showing a state that a write circuit and read circuit are connected to the antifuse element shown in FIGS. 1A and 1B.

FIG. 2 is a circuit diagram showing a state that a write circuit and read circuit are connected to the antifuse element 100 according to the first embodiment.

As shown in FIG. 2, a write circuit 180 is configured by a switch connected between the upper wiring 141 which leads to the gate electrode 110 and a write voltage Vpp. A read circuit 190 is configured by a switch 191 connected between the upper wiring 141 and a read voltage Vdd and a comparator 192 connected to the upper wiring 142 which leads to the diffusion layer region 122.

In the initial state of the antifuse element 100, the gate electrode 110 is isolated from the channel region 120 by the gate insulating film 130. The resistance between the upper wirings 141 and 142 is thus substantially infinity. Current does not flow between the upper wirings 141 and 142. Even if the switch 191 shown in FIG. 2 is turned on, the potential of the upper wiring 142 changes little. In such a state, outputs from the comparator 192 are at a low level. It is detected that the antifuse element 100 is not subjected to breakdown.

When the write circuit 180 is turned on, a high voltage is applied to the gate electrode 110 so that the gate insulating film 130 is subjected to dielectric breakdown. The gate electrode 110 is thus connected to the channel region 120. Because the channel region 120 is of the depletion type, the gate electrode 110 is electrically connected to the diffusion layer region 122 via the channel region 120 when the gate insulating film 130 is subjected to breakdown. The resistance between the upper wirings 141 and 142 is reduced.

When the switch 191 shown in FIG. 2 is turned on, the potential of the upper wiring 142 is increased and outputs from the comparator 192 are at a high level. It is detected that the antifuse element 100 is subjected to breakdown.

As described above, the researches of the present inventor found that breakdown is likely to occur at the ends of the gate insulating film as compared to the central part. According to the antifuse element of the first embodiment, because the end 111 of the gate electrode 110 is formed in a zigzag configuration, it is longer than linear ends. Breakdown is thus likely to occur at the zigzag-shaped end. If the end is subjected to breakdown, the distance of a current path through the channel region 120 becomes substantially zero.

Figure 3A:
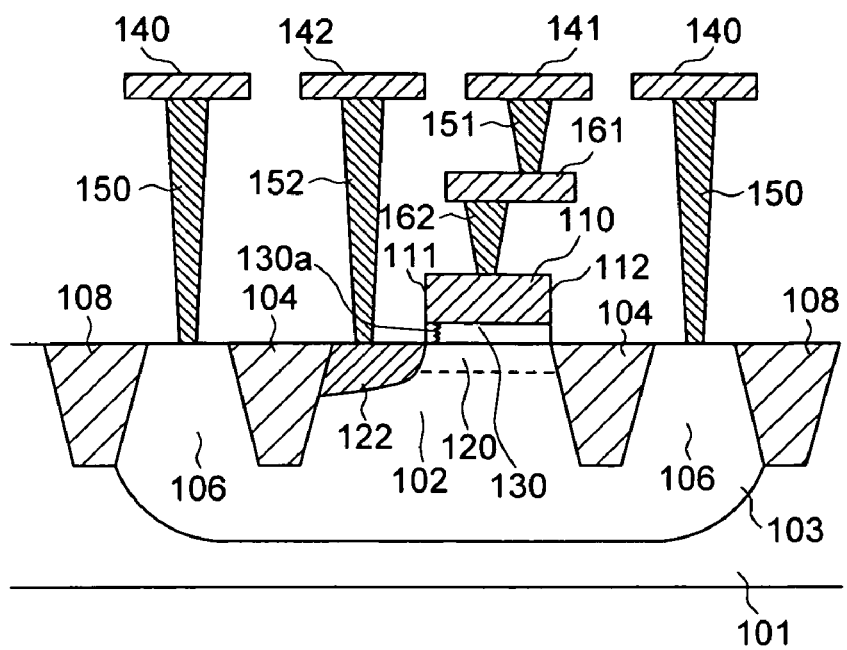
FIG. 3A shows a schematic cross-sectional view of the antifuse element in the breakdown state.
Figure 3B:
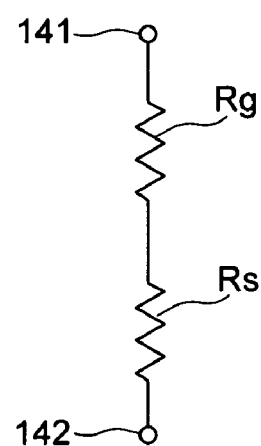
FIG. 3B is an equivalent circuit diagram of FIG. 3A.

FIGS. 3A and 3B show the antifuse element 100 in the breakdown state, where FIG. 3A is a schematic cross-sectional view, and FIG. 3B is an equivalent circuit diagram.

As shown in FIG. 3A, when a high voltage is applied to the gate electrode 110, a breakdown region 130a is formed in the vicinity of the diffusion layer region 122. The resistance Rde between the upper wirings 141 and 142 is defined, as shown in FIG. 3B, as the sum of the resistance component Rg for the gate electrode 110 and the breakdown region 130a and the channel resistance component Rs. Because the breakdown region 130a is formed in the vicinity of the end 111 of the gate electrode 110, the channel resistance component Rs becomes much smaller than conventional cases.

As described above, the antifuse element 100 according to the first embodiment realizes a smaller variation in resistance after breakdown. A threshold Vref inputted to the comparator 192 is easily set and wrong determination is thus avoided. Reduced resistance after breakdown allows for determination in a short time.

One of the source region and drain region is removed in the first embodiment. The electric field applied between the gate electrode 110 and the channel region 120 during breakdown is biased. Breakdown is likely to occur at the end 111. Because the source region or drain region is removed, the area the antifuse element 100 occupies is reduced. If breakdown occurs at the removed side (on the right side in FIGS. 1A and 1B), the resistance after breakdown may be increased. Breakdown hardly occurs at the removed side because, as described above, the electric field is biased and the end 112 of the gate electrode 110 on the removed side has a linear configuration.

Figure 4A:
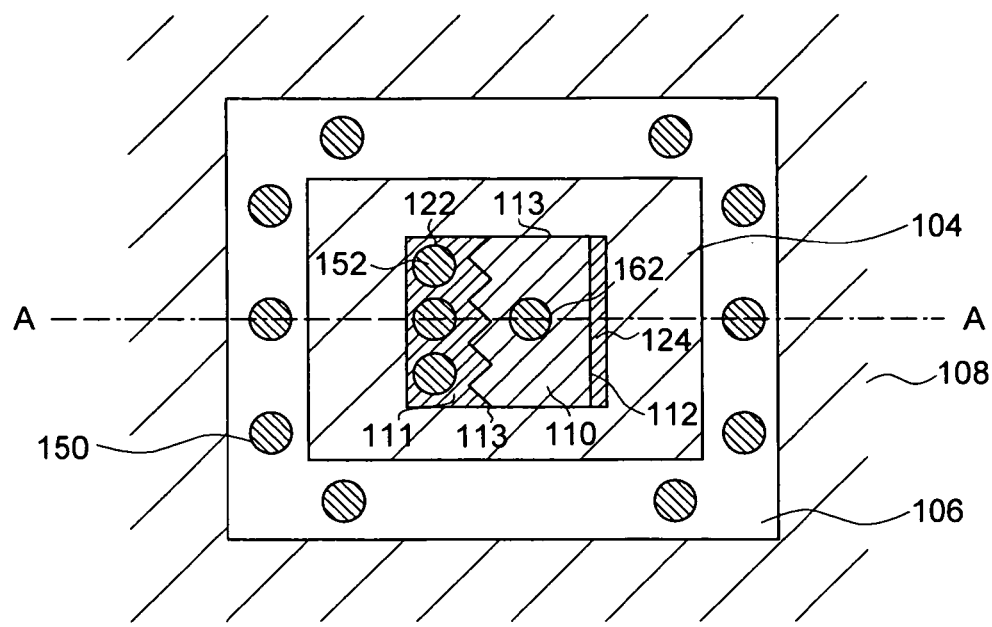
FIG. 4A shows a schematic plan view of an antifuse element according to a modified embodiment of the present invention.
Figure 4B:
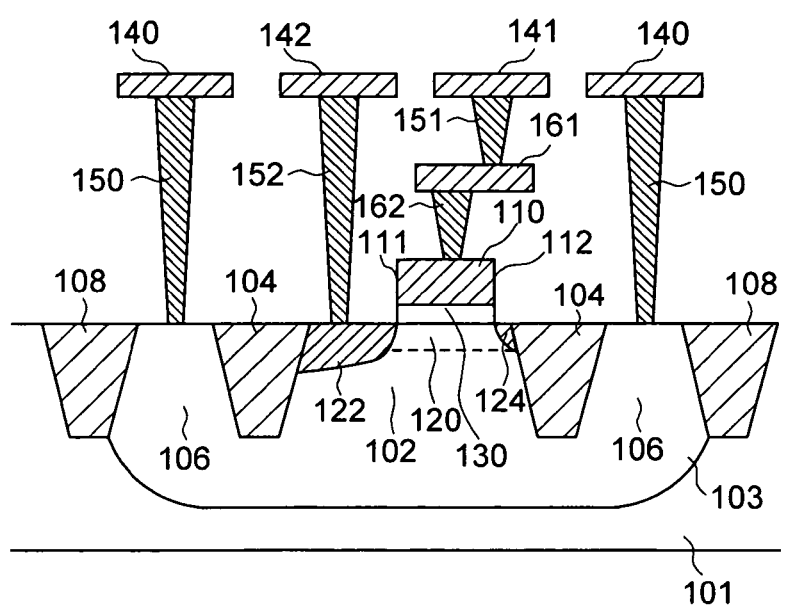
FIG. 4B shows a schematic cross-sectional view along the line A-A in FIG. 4A.

According to the present invention, either the source region or the drain region does not need to be removed. As shown in FIG. 4B, which is a schematic cross-sectional view, another unused diffusion layer region 124 can be provided on a side opposite to the diffusion layer region 122, as seen from the gate electrode 110. Even if the diffusion layer region 124 is provided, it does not need to be connected to the upper wirings, and therefore the size of the diffusion layer region 124 does not need to be so large that contacts can be formed therein.

The contact 162 connecting the gate electrode 110 to the upper wiring 161 is placed immediately above the channel region 120 in the first embodiment. The contact region does not need to be formed separately, resulting in even reduced occupied area.

Figure 5:
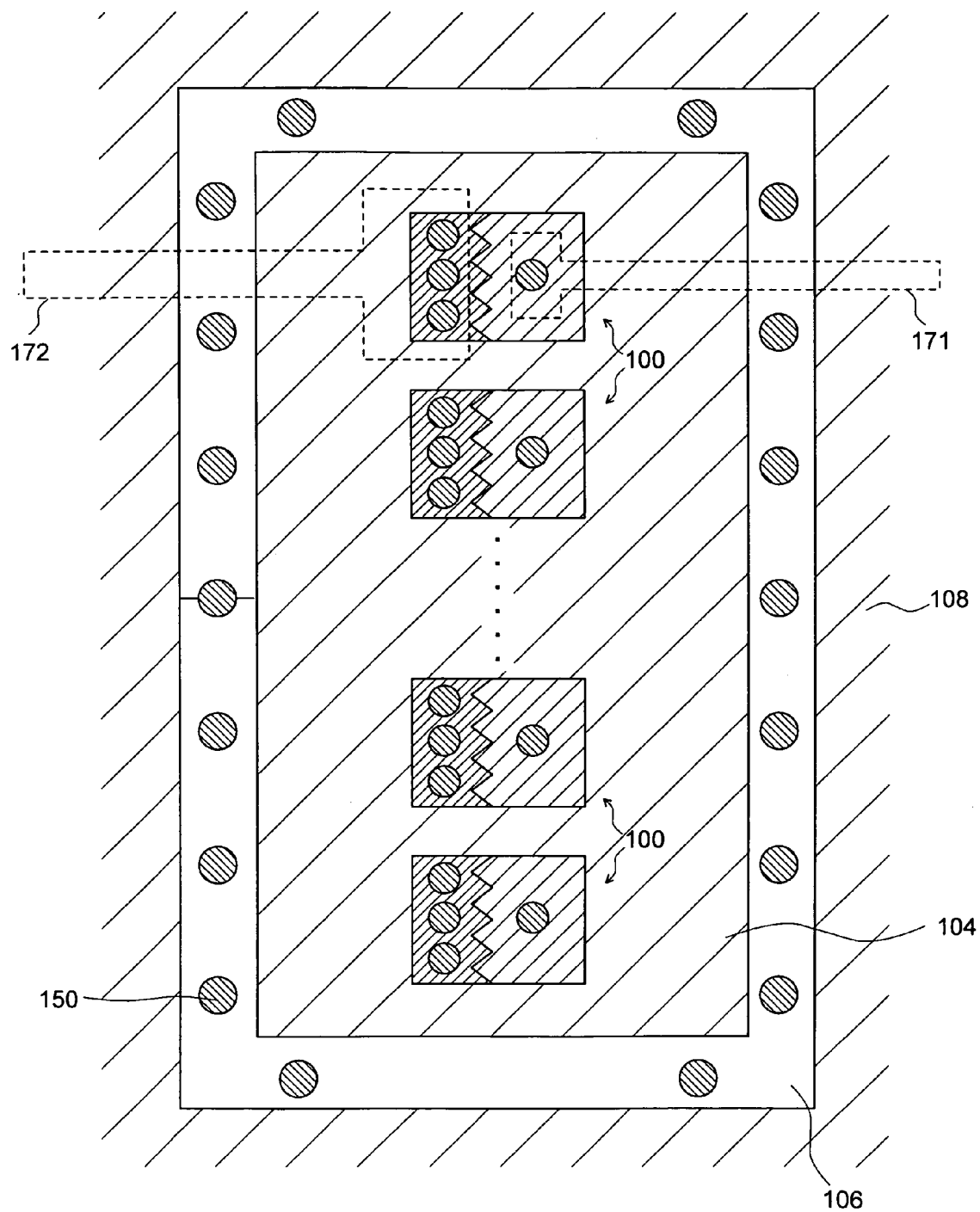
FIG. 5 is a schematic plan view of an example that a plurality of the antifuse elements are arranged in an array.

FIG. 5 is a schematic plan view of an example that a plurality of the antifuse elements 100 are arranged in an array.

As shown in FIG. 5, when a plurality of the antifuse elements 100 are arranged in an array, the ring-shaped contact region 106 does not need to be provided for each of the antifuse elements. The plurality of the antifuse elements 100 are surrounded by the single contact region 106. Although the antifuse elements 100 are separated from each other by the element isolation region from a planar point of view, such separation is sufficient for the antifuse elements 100. The total occupied area is reduced as compared to the case of providing the contact region 106 for each of the antifuse elements 100.

The antifuse element is a two-terminal element unlike conventional antifuse elements which are three-terminal elements. As shown in FIG. 5, an upper wiring 171 extending to the right side is connected to the gate electrode 110, while an upper wiring 172 extending to the left side to the diffusion layer region 122, resulting in a simplified layout.

Figure 6A:
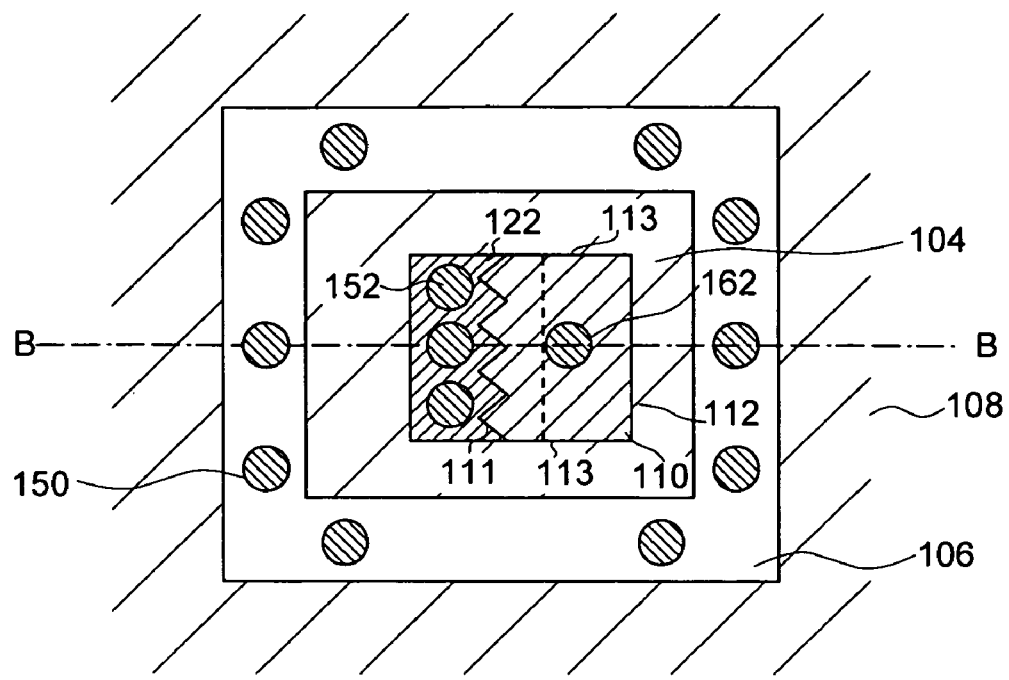
FIG. 6A shows a schematic plan view of an antifuse element according to a second embodiment of the present invention.
Figure 6B:
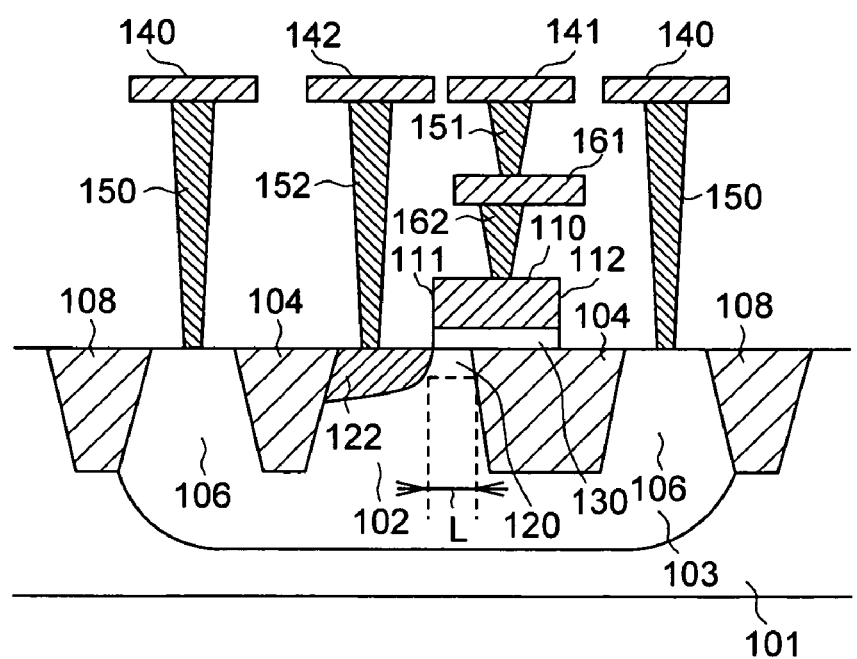
FIG. 6B shows a schematic cross-sectional view along the line B-B in FIG. 6A.

FIGS. 6A and 6B show a configuration of an antifuse element 200 according to a second embodiment of the present invention, where FIG. 6A is a schematic plan view, and FIG. 6B is a schematic cross-sectional view along the line B-B shown in FIG. 6A. A part of components including upper wirings is omitted in FIG. 6A for clarity of illustration.

According to the antifuse element 200 according to the second embodiment, the length L of the channel region 120 is reduced greatly and the end 112 of the gate electrode 110 is placed above the element isolation region 104. Because the antifuse element 200 is the same as the antifuse element 100 shown in FIG. 1 in other respects, like reference numerals are denoted to like components and explanations thereof will be omitted.

Because most part of the gate insulating film 130 which does not expect breakdown is placed on the element isolation region 104 in the second embodiment, breakdown does not occur at this part. Breakdown thus occurs at the zigzag-shaped end 111 with much higher possibility. Even if breakdown occurs not at the ends but at other parts, the resistance of the channel region 120 is reduced sufficiently because of its reduced length.

Accordingly, variations in resistance after breakdown are further suppressed and the resistance after breakdown is further reduced. Further, because the active region 102 is reduced, the area the antifuse element 200 occupies is reduced correspondingly.

Normally, the part of the gate electrode 110 placed on the element isolation region 104 is not necessary. If the part is removed, however, the gate electrode 110 becomes so thin that it may be peeled away during patterning and the contact 162 is difficult to be formed. As shown in FIGS. 6A and 6B, it is thus preferable to form the gate electrode 110 above the element isolation region 104.

Figure 7A:
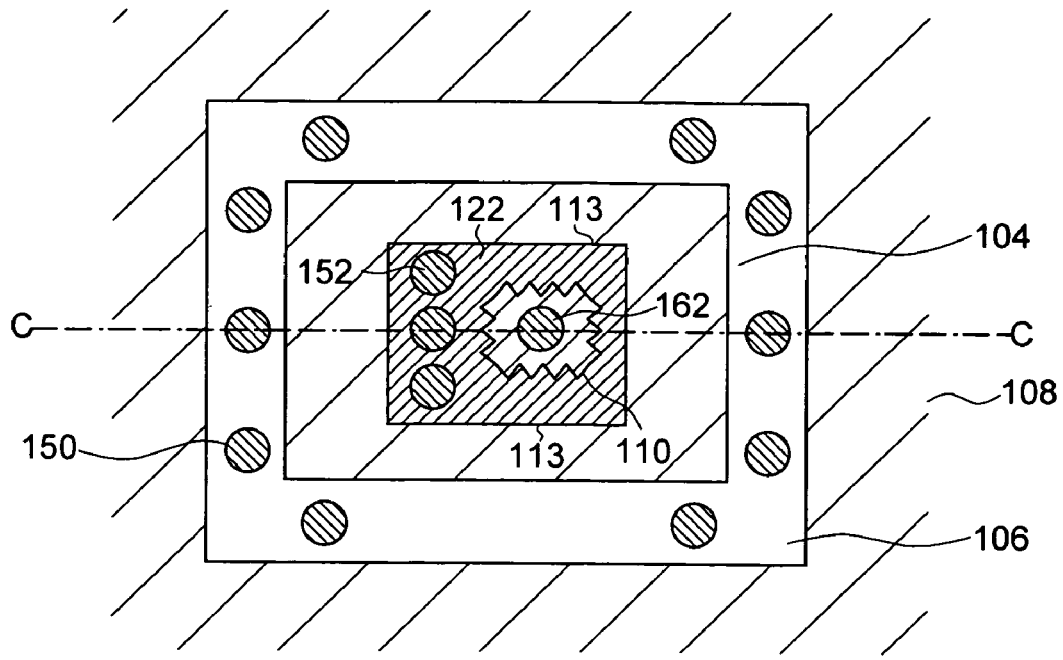
FIG. 7A shows a schematic plan view of an antifuse element according to a third embodiment of the present invention.
Figure 7B:
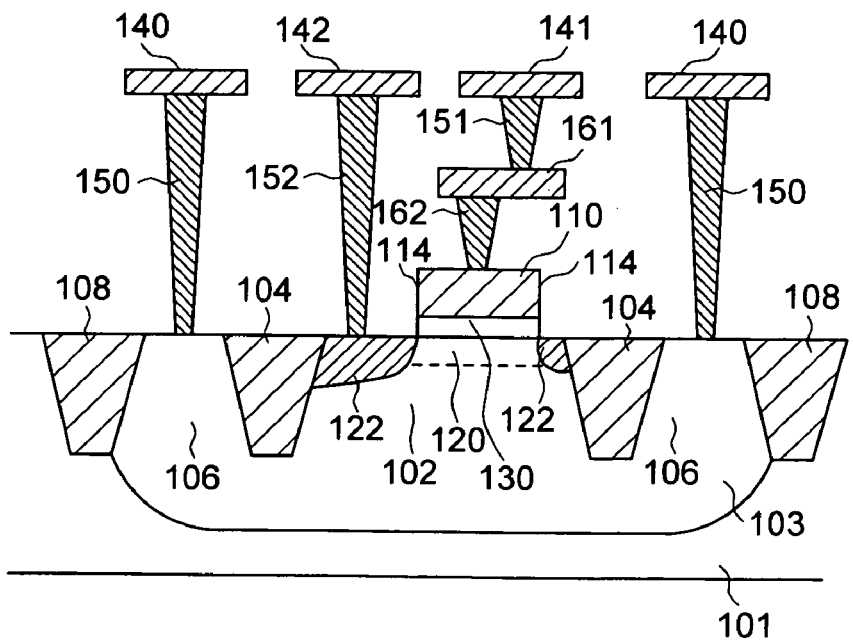
FIG. 7B shows a schematic cross-sectional view along the line C-C in FIG. 7A.
Figure 8A:
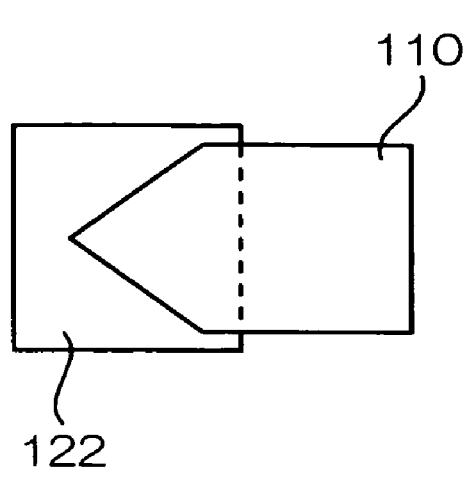
FIGS. 8A to 8D are variations of the configuration of the gate electrode.
Figure 8B:
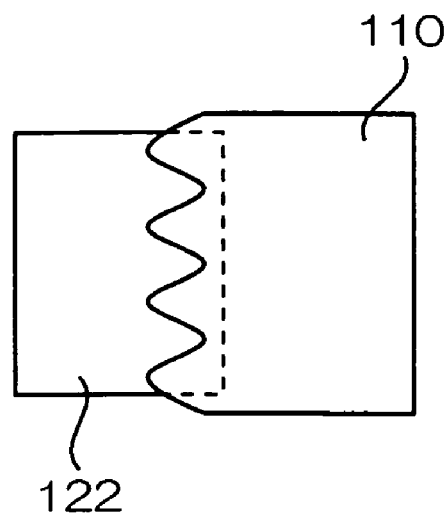
Figure 8C:
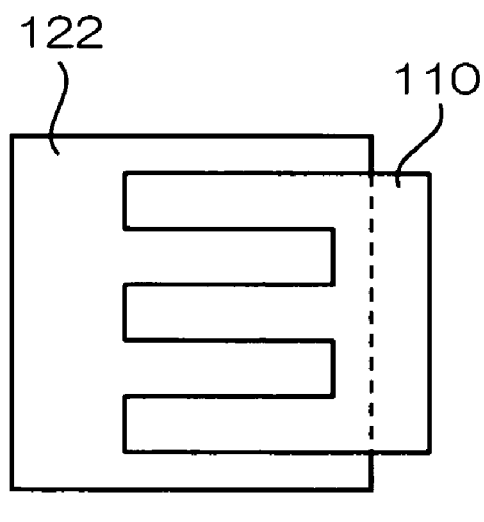
Figure 8D:
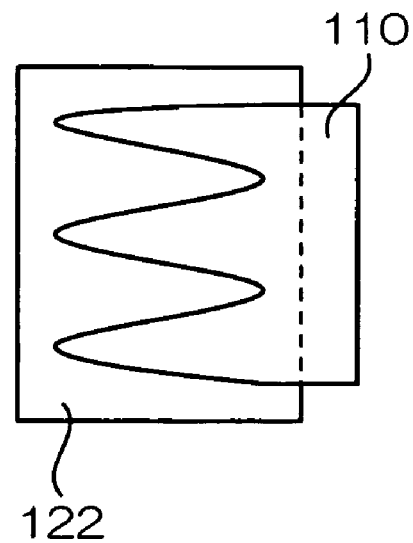
Figure 9:
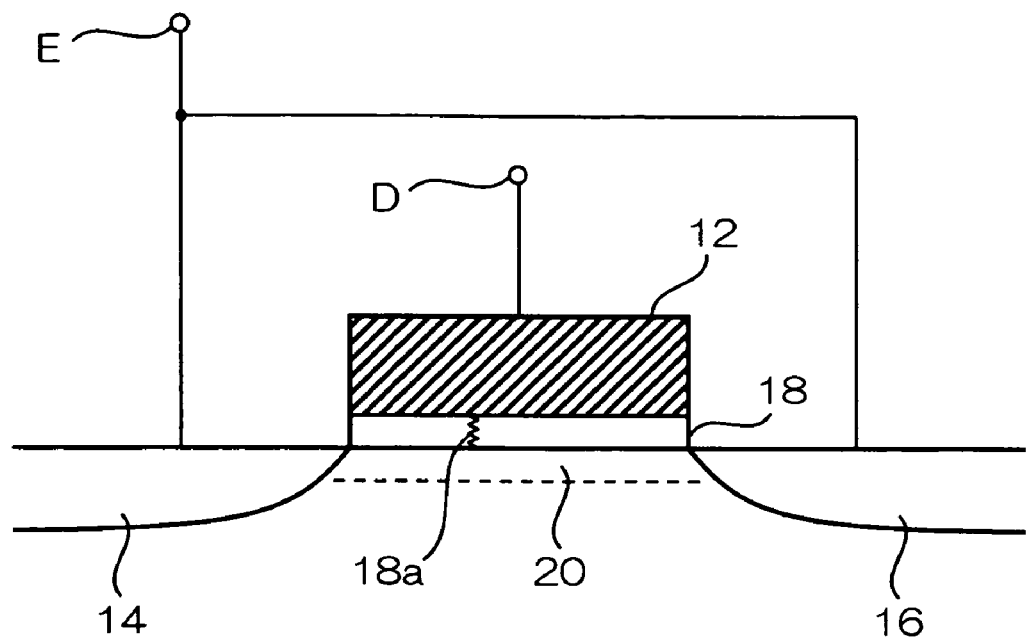
FIG. 9 is a schematic diagram of a configuration of a conventional antifuse element.
Figure 10:
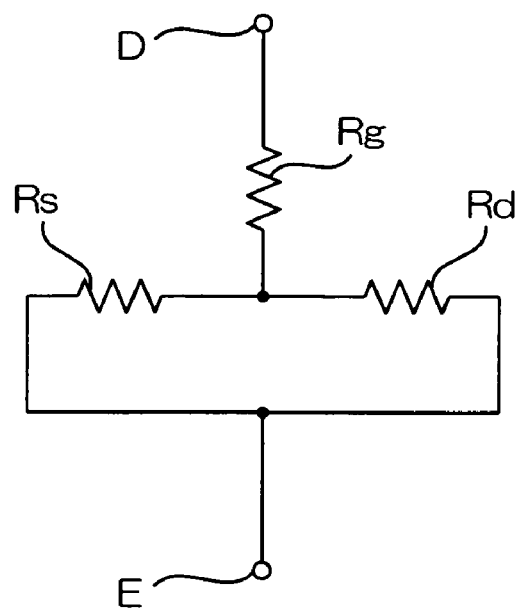
FIG. 10 is an equivalent circuit diagram of the antifuse element shown in FIG. 9 in the breakdown state.

FIGS. 7A and 7B show a configuration of an antifuse element 300 according to a third embodiment of the present invention, where FIG. 7A is a schematic plan view, and FIG. 7B is a schematic cross-sectional view along the line C-C shown in FIG. 7A. A part of components including upper wirings is omitted in FIG. 7A for clarity of illustration.

According to the antifuse element 300 of the third embodiment, the gate electrode 110 is formed above the active region 102 like an island and the periphery of the gate electrode 110 including the end 114 is formed in a zigzag configuration. Because the antifuse element 300 is the same as the antifuse element 100 shown in FIG. 1 in other respects, like reference numerals are denoted to like components and explanations thereof will be omitted.

In the third embodiment, because the periphery of the gate electrode 110 is formed in a zigzag configuration, breakdown is likely to occur at the periphery. Therefore, although the occupied area is slightly increased, variations in resistance after breakdown are suppressed and the resistance after breakdown is reduced.

The present invention is in no way limited to the aforementioned embodiments, but rather various modifications are possible within the scope of the invention as recited in the claims, and naturally these modifications are included within the scope of the invention.

For example, while the ends 111 and 114 of the gate electrode 110 are formed in a zigzag configuration in the antifuse elements 100, 200, 300 of the above embodiments, the present invention is not limited to such a configuration, and any non-linear configurations will suffice. Considering that as the end of the gate electrode becomes longer, breakdown is likely to occur in the vicinity of the end, configurations that realize effectively long distance of the unit interval like the zigzag configuration are preferably used.

Variations of the configuration of the gate electrode 110 are shown in FIGS. 8A to 8D. Such variations all belong to "the zigzag configuration" in the present invention. The planar configuration of the gate electrode does not coincide perfectly with the pattern on a reticle and patterns with some rounded off corners are provided. Such patterns with rounded off corners are included in the zigzag configuration.

What is claimed is:

1. An antifuse element comprising:
an upper electrode;
a lower electrode;
an insulating film located between the upper electrode and the lower electrode; and
an extraction electrode located adjacent to the lower electrode,
wherein the upper electrode and the extraction electrode can be electrically connected via the lower electrode by forming a breakdown region in the insulating film,
wherein at least a part of an end of the upper electrode substantially coincides with a boundary between the lower electrode and the extraction electrode as seen from a planar view, and is formed in a non-linear configuration, and
wherein the upper electrode is a gate electrode connected to a first upper wiring, the extraction electrode is a diffusion layer region connected to a second upper wiring, and the lower electrode is a depletion channel region forming a junction with the diffusion layer region.

2. An antifuse element comprising:
an upper electrode;
a lower electrode;
an insulating film located between the upper electrode and the lower electrode; and
an extraction electrode located adjacent to the lower electrode,
wherein the upper electrode and the extraction electrode can be electrically connected via the lower electrode by forming a breakdown region in the insulating film,
wherein at least a part of an end of the upper electrode substantially coincides with a boundary between the lower electrode and the extraction electrode as seen from a planar view, and is formed in a non-linear configuration, and
wherein a part of the upper electrode is formed on an element isolation region.

3. A semiconductor device comprising:
an antifuse element,
a write circuit, and
a read circuit,
wherein the antifuse element includes:
an upper electrode;
a lower electrode;
an insulating film located between the upper electrode and the lower electrode; and
an extraction electrode located adjacent to the lower electrode,
wherein the upper electrode and the extraction electrode can be electrically connected via the lower electrode by forming a breakdown region in the insulating film, and at least a part of an end of the upper electrode substantially coincides with a boundary between the lower electrode and the extraction electrode as seen from a planar view, and is formed in a non-linear configuration,
wherein the write circuit can form the breakdown region in the insulating film by applying a high voltage to the upper electrode, and the read circuit can detect resistance between the upper electrode and the extraction electrode, and
wherein the extraction electrode is located adjacent to a first end of the lower electrode, a second end of the lower electrode which is opposite the first end being adjacent to one of an element isolation region and a diffusion layer region having a size which is less than a size of the extraction electrode.

4. An antifuse element comprising:
an upper electrode;
a lower electrode;
an insulating film located between the upper electrode and the lower electrode; and
an extraction electrode located adjacent to the lower electrode,
wherein the upper electrode and the extraction electrode can be electrically connected via the lower electrode by forming a breakdown region in the insulating film,
wherein at least a part of an end of the upper electrode substantially coincides with a boundary between the lower electrode and the extraction electrode as seen from a planar view, and is formed in a non-linear configuration, and
wherein the extraction electrode is located adjacent to a first end of the lower electrode, a second end of the lower electrode which is opposite the first end being adjacent to one of an element isolation region and a diffusion layer region having a size which is less than a size of the extraction electrode.

5. An antifuse element comprising:
an upper electrode;
a lower electrode;
an insulating film located between the upper electrode and the lower electrode; and
an extraction electrode located adjacent to the lower electrode,
wherein the upper electrode and the extraction electrode can be electrically connected via the lower electrode by forming a breakdown region in the insulating film,
wherein at least a part of an end of the upper electrode substantially coincides with a boundary between the lower electrode and the extraction electrode as seen from a planar view, and is formed in a non-linear configuration, and
wherein the extraction electrode comprises a diffusion layer region connected to an upper wiring, and the lower electrode comprises a depletion channel region forming a junction with the diffusion layer region.

6. The antifuse element as claimed in claim 1, wherein the part of the end of the upper electrode is formed in a zigzag configuration.

7. The antifuse element as claimed in claim 1, wherein an element isolation region is provided at an opposite side to the diffusion layer region, as seen from the gate electrode, without another diffusion layer region connected to the upper wiring intervening between the gate electrode and the element isolation region.

8. The antifuse element as claimed in claim 1, wherein a contact electrode connecting the gate electrode to the first upper wiring is placed immediately above the channel region.

9. The antifuse element as claimed in claim 4, wherein the extraction electrode comprises a first diffusion layer region, and the second end of the lower electrode which is opposite the first end is adjacent to the second diffusion layer region.

10. The antifuse element as claimed in claim 9, wherein the lower electrode comprises a channel region having a first end which forms the boundary with the first diffusion layer region, and a second end which is opposite the first end of the channel region and forms a boundary with the second diffusion layer region.

11. The antifuse element as claimed in claim 4, wherein the second end of the lower electrode which is opposite the first end is adjacent to the element isolation region.

12. The antifuse element as claimed in claim 1, wherein the upper electrode further comprises an other end which is opposite the end and includes a length which is less than a length of the end.

13. The antifuse element as claimed in claim 12, wherein the length of the end is at least 50% greater than the length of the other end.

14. The antifuse element as claimed in claim 1, wherein the insulating film includes an end which coincides with the boundary between the lower electrode and the extraction electrode, the breakdown region being formed at the end of the insulating film.

15. The antifuse element as claimed in claim 4, wherein the second end of the lower electrode is adjacent to the element isolation region, and the lower electrode comprises a channel region which is formed in an active region and is surrounded by the element isolation region which is surrounded by a contact region.

16. The antifuse element as claimed in claim 5, further comprising:
a contact electrode formed above the channel region and connecting the upper electrode to the an upper wiring.

* * * * *